(12) United States Patent
Shiu et al.

(10) Patent No.: US 7,129,878 B1
(45) Date of Patent: Oct. 31, 2006

(54) DIGITAL TO ANALOG CONVERTER

(75) Inventors: Shian Sung Shiu, Taipei (TW); Li-Min Lee, Taipei (TW); Chung-Che Yu, Taipei (TW)

(73) Assignee: Beyond Innovation Technology Co., Ltd, Taipei (TW)

( * ) Notice: Subject to any disclaimer, the term of this patent is extended or adjusted under 35 U.S.C. 154(b) by 0 days.

(21) Appl. No.: 11/155,708

(22) Filed: Jun. 16, 2005

(51) Int. Cl.
*H03M 1/66* (2006.01)
(52) U.S. Cl. .................... 341/154; 341/144
(58) Field of Classification Search ........... 341/154, 341/118, 120, 135, 136, 144; 345/89, 92
See application file for complete search history.

(56) References Cited

U.S. PATENT DOCUMENTS

| | | | | |
|---|---|---|---|---|
| 4,553,132 A * | 11/1985 | Dingwall et al. | ........... | 341/136 |
| 5,764,174 A * | 6/1998 | Dempsey et al. | ........... | 341/154 |
| 6,222,473 B1 * | 4/2001 | Castaneda et al. | ......... | 341/154 |
| 6,380,917 B1 * | 4/2002 | Matsueda et al. | ............ | 345/89 |
| 6,400,298 B1 * | 6/2002 | Lee | ............... | 341/144 |
| 6,414,616 B1 * | 7/2002 | Dempsey | .................... | 341/144 |
| 6,509,854 B1 * | 1/2003 | Morita et al. | ................ | 341/144 |
| 6,707,404 B1 * | 3/2004 | Yilmaz | ....................... | 341/120 |
| 6,937,178 B1 * | 8/2005 | Rempfer et al. | ............ | 341/154 |
| 6,958,719 B1 * | 10/2005 | Moon | ......................... | 341/135 |

\* cited by examiner

*Primary Examiner*—Jean Bruner Jeanglaude

(57) ABSTRACT

A digital to analog converter for an analog Liquid Crystal Display (LCD) includes a digital inlet, a latching circuitry, a voltage level shifter circuitry, a switching circuitry, and a resistance network with a resistance compensatory circuitry. The resistance network with the resistance compensatory circuitry is electrically connecting with the switching circuitry and adapted to regulate a pattern of the analog output signal so as to optimize the analog output signal. Specifically, the resistance network with a resistance compensatory circuitry is to produce the best linear conversion from the digital signal to the analog signal for use by the LCD.

26 Claims, 10 Drawing Sheets

DIGITAL TO ANALOG CONVERTER

BACKGROUND OF THE PRESENT INVENTION

1. Field of Invention

The present invention relates to a digital to analog converter, and more particularly to a digital to analog converter with resistance network with a resistance compensatory circuitry which is adapted to optimally convert a digital signal into an analog signal for use by analog-type LCDs.

2. Description of Related Arts

Liquid Crystal Displays (LCD) have been widely accepted as a major alternative to traditional Cathode-Ray Tube (CRT) display. They have the advantages of being smaller in size, clearer in displaying images, and substantially reducing radiation. There exist two major types of LCD, namely, analog and digital LCDs. The distinction implies that the LCD in question may only accept respectively, analog or digital signals for displaying a particular image on the screen. In order to process digital signals in an analog LCD, or vice versa, it definitely requires a converter which is capable of converting a digital signal into an analog signal or vice versa.

Generally speaking, analog LCDs enjoy considerable competitive power as compared with digital LCDs. What this implies is that the need for a better quality converter never stops. As a matter of fact, almost all converters which are capable of transforming digital input signals into analog output signals involve certain loss or distortions in the signal converted. The key question becomes how to minimize such loss or distortion during signal conversion, while at the same time keeping the conversion process efficient and economical.

A digital to analog converter with improved switched R-2R network is described in U.S. Pat. No. 6,222,473. There are a variety of digital to analog converters available for converting digital input signals into analog output signals depending upon the desired conversion functionality. The variations in the digital to analog converters available may have different predetermined resolutions of a digital input signal, receive different encoded digital input signals, have different ranges of analog output signals using a fixed reference or a multiplied reference, and provide different types of analog output signals. Additionally, there are a number of digital to analog converter performance factors to consider such as settling time, full scale transition time, accuracy or linearity, and a factor previously mentioned, resolution.

The digital input signal is a number of bits wide, defining the resolution, the number of output levels or quantization levels and the total number of digital codes that are acceptable. If the digital input signal is n-bits wide, there are $2^n$ output levels and $2^{n-1}$ steps between levels. The digital input signals may be encoded in straight binary, two's complement, offset binary, gray scale code, binary coded decimal or other digital coding. The range of analog output signal values usually depends upon an analog reference. The analog reference may be internally generated but is usually externally provided for precision. The analog output signal range may be proportional to the digital input signal over a fixed analog reference level as in a fixed reference digital to analog converter. Alternatively, the analog output signal may be the product of a varying input analog reference level and the digital code of the digital input signal as in multiplying digital to analog converters. The analog output signal may be unipolar ranging in either positive values or negative values or it may be bipolar ranging between both positive and negative output values. The analog output signal may be an analog voltage signal or an analog current signal.

Additionally, the type of electronic circuitry used to form a digital to analog converter varies as well. Bipolar junction transistor (BJT) technology, metal oxide semiconductor (MOS) technology or a combination thereof is used to construct digital to analog converters. BJT technology may be PNP technology with PNP transistors or NPN with NPN transistors or both, while MOS technology may be PMOS with P-channel field effect transistors (PFET), NMOS with N-channel field effect transistors (NFET) or CMOS technology having both PFETs and NFETs.

Referring to FIG. 1 of the drawings, a conventional digital to analog converter is usually embodied as an R-2R network digital to analog converter comprising a R-2R network. The R-2R network digital to analog converter usually comprises an R-2R network 121, a switching circuitry 111, and a digital signal input 131 which contains a four digital input terminals D0, D1, D2, D3, appeared in the FIG. 1.

The R-2R network 121 comprises resistors 124, 126, 128 each having a predetermined resistance r, resistors 122, 123, 125, 127, 129 each having a predetermined resistance R which is twice the resistance r. In other words, R=2r.

The switching circuitry 111 comprises four switches 112, 113, 114, 115 wherein each of the switches 112, 113, 114, 115 comprises an inverter 201, a CMOS transmission gate 202, two PMOS transistors 212, 222, and two NMOS transistors 213, 223.

The R-2R network digital to analog converter usually comprises the digital input 131, the R-2R network 121, the switching circuitry 111, and the digital input 131, an analog supply voltage level $V_{DD}$, and a ground level GND. The digital input terminals D0, D1, D2, D3 individually control switches 112, 113, 114, 115 to cause the R-2R network digital to analog converter convert the value of the digital input 131 into the analog output signal. The linearity of an R-2R network digital to analog converter is very important for accurate conversions and is usually specified in units of least significant bits (LSB) of the n-bit of the digital input 131. Under an idealized situation the R-2R network digital to analog converter could have a good linearity for accurate conversions if the resistance of each resistor of the R-2R network 121 is greater than the intrinsic resistance of the corresponding switches 112, 113, 114, 115.

There are disadvantages regarding this conventional R-2R network digital to analog converter which is applied to an analog LCD. A conventional analog LCD comprises a RGB terminal comprising a red video terminal, a green video terminal, and a blue video terminal for receiving analog RGB signals respectively through a convention AV cable comprising three wires, which are connected to the analog LCD via the video red terminal, the video green terminal, and the video blue terminal respectively. The equivalent input impedance of each of the video red terminal, the video green terminal, and the video blue terminal of the analog LCD could be treated as a capacitive loading. As a result, when the conventional R-2R network digital to analog converter is utilized in practice, one may implement three separate R-2R network digital to analog converter for converting three distinct digital signals, video red signal, video green signal, and video blue signal, to three distinct analog signals. The resistances of resistors 124, 126, and 128 of the R-2R network 121 and resistors having a predetermined resistance 2r must be reduced in order to change the analog output voltage from a maximum value to a minimum value or vice versa in a fixed unit time period when the input signals of the digital input terminals D0, D1, D2, D3 of the digital input 131 are suddenly changed from high voltage levels to low voltage levels or vice versa. However, the linearity of the R-2R network digital to analog converter becomes poor when the resistances of resistors of the R-2R network 121 are reduced. In other words, signal distortion or loss is expected to be very severe. It is due to that the resistance of each resistor of the R-2R network 121 is not greater than the intrinsic resistance of the corresponding switches 112, 113, 114, 115.

Referring to FIG. 3 of the drawings, in order to resolve these severe distortion and signal loss problems, a unity gain buffer 321 is coupled to the R-2R network digital to analog converter 301. With the help of the unity gain buffer 321, the resistances of the R-2R network digital to analog converter 301 would select an optimal value which is greater than intrinsic resistance of the switches 303,304,305,306 in order to optimize the performance of the digital-analog converter.

However, a major drawback of employing this unity gain buffer 321 is that a high quality unity gain buffer 321 is usually expensive. Moreover, the performance of the digital to analog converter is then solely dependent on the performance and characteristics of the unity gain buffer 321 such that the flexibility in introducing any additional features to the R-2R network digital to analog converter is substantially undermined.

SUMMARY OF THE PRESENT INVENTION

A main object of the present invention is to provide a digital to analog converter which is adapted to optimally convert a digital signal into an analog signal for use by analog-type LCDs, without using any unity gain buffer to accompany high quality performance of the digital to analog converter.

Another object of the present invention is to provide a digital to analog converter comprising a resistance network with a resistance compensatory circuitry which is adapted to flexibly regulate an optimal analog output by to compensate the nonlinear phenomena caused by intrinsic resistances of the corresponding switch to produce an optimal linear and accurate digital to analog conversion.

Another object of the present invention is to provide a digital to analog converter which is capable of minimizing accurate and effective transformation from a digital signal to an analog signal so as to resolves the difficulties subsisted in conventional arts.

Accordingly, in order to accomplish the above objects, the present invention provides a n-bit resolution digital to analog converter to convert a digital input signal into an analog output signal, comprising:

a digital input having a plurality of digital input terminals for receiving the digital input signal;

a latching circuitry electrically connected with the digital input and adapted to store the digital input signal in the binary information received at the digital input;

a voltage level shifter circuitry electrically connected with the latching circuitry and adapted to shift the digital input signal to a digital output signal, wherein a voltage level of the digital output signal is higher than that of the digital input signal;

a switching circuitry comprising a plurality of switches, each switch comprising:

an output terminal;

a first input terminal electrically connected with a second voltage source in which the second voltage source provides a second reference DC voltage;

a second input terminal electrically connected with a first voltage source in which the first voltage source provides a first reference DC voltage; and a control terminal electrically connected with the voltage level shifter circuitry for selectively coupling one of the first input terminal and the second input terminal to the output terminal such that one of the first reference DC voltage and the second reference DC voltage outputted to the output terminal is determined by the digital input signal; and a resistance network with a resistance compensatory circuitry comprising:

a set of series resistors;

a plurality of CMOS compensatory circuitries electrically connected between each of the series resistors; and a set of shunt resistors each electrically connected to a plurality of common nodes of the series resistors and the CMOS compensatory circuitries respectively, wherein the CMOS compensatory circuitries are adapted to adjust the conversion from the digital input signal into the analog output signal.

These and other objectives, features, and advantages of the present invention will become apparent from the following detailed description, the accompanying drawings, and the appended claims.

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

Figure 1:
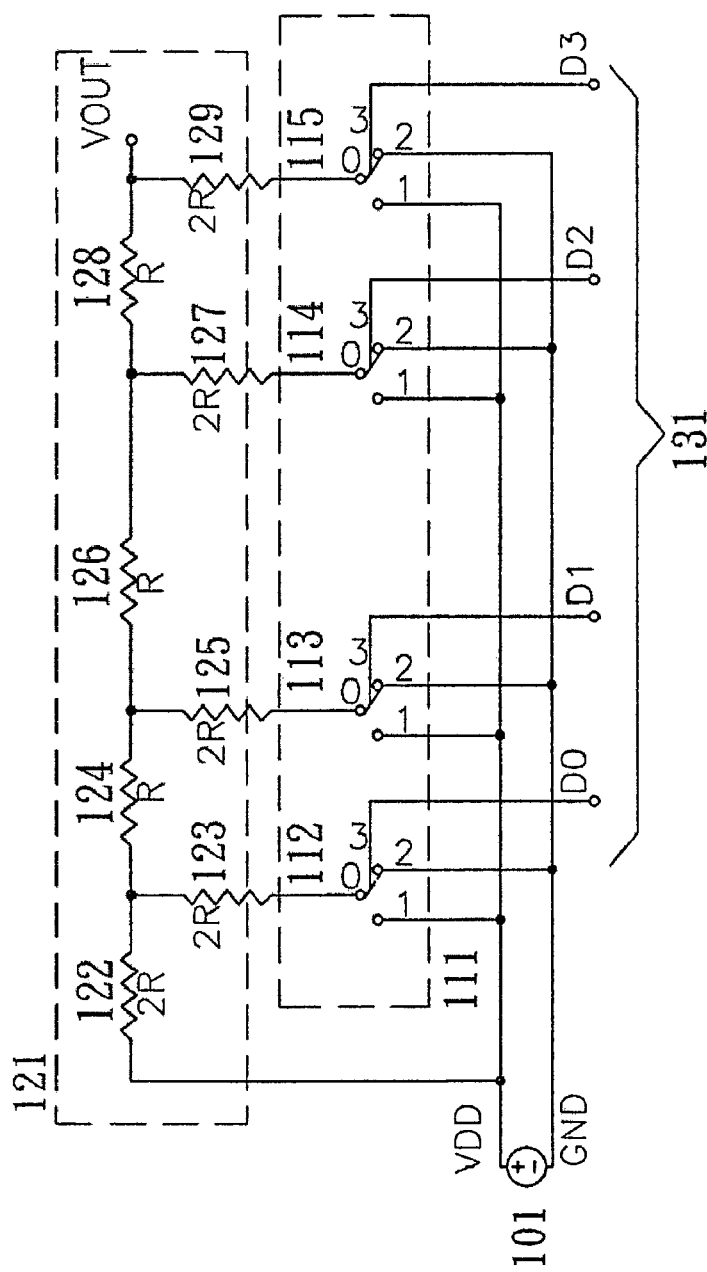
FIG. 1 is a circuit diagram of a conventional digital to analog converter.
Figure 2:
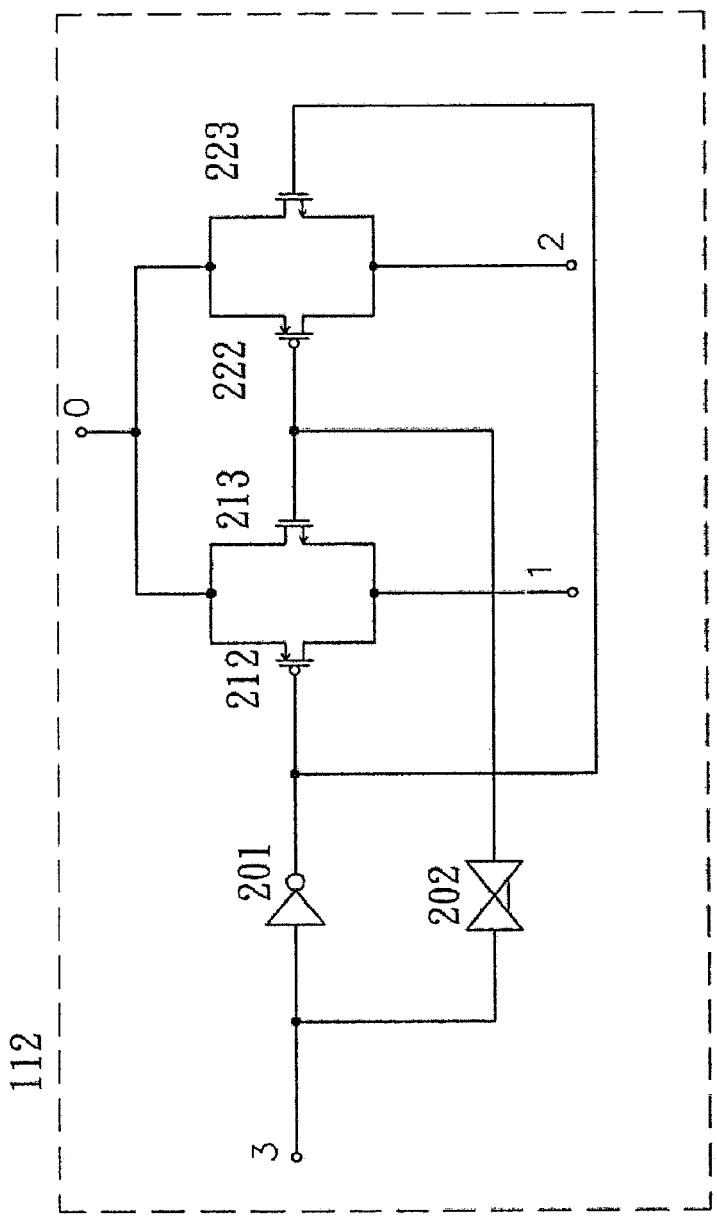
FIG. 2 is a circuit diagram of a conventional switch.
Figure 3:
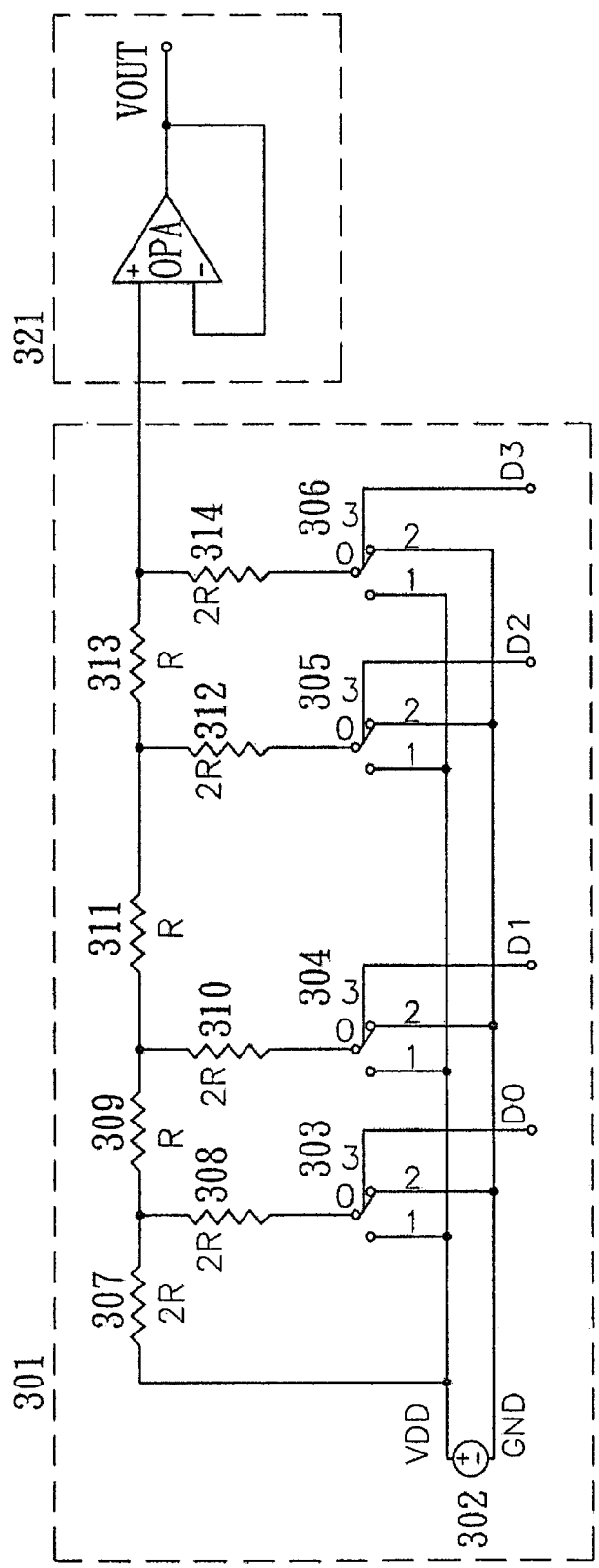
FIG. 3 is a circuit diagram of a conventional digital to analog converter with a unity gain buffer.
Figure 4:
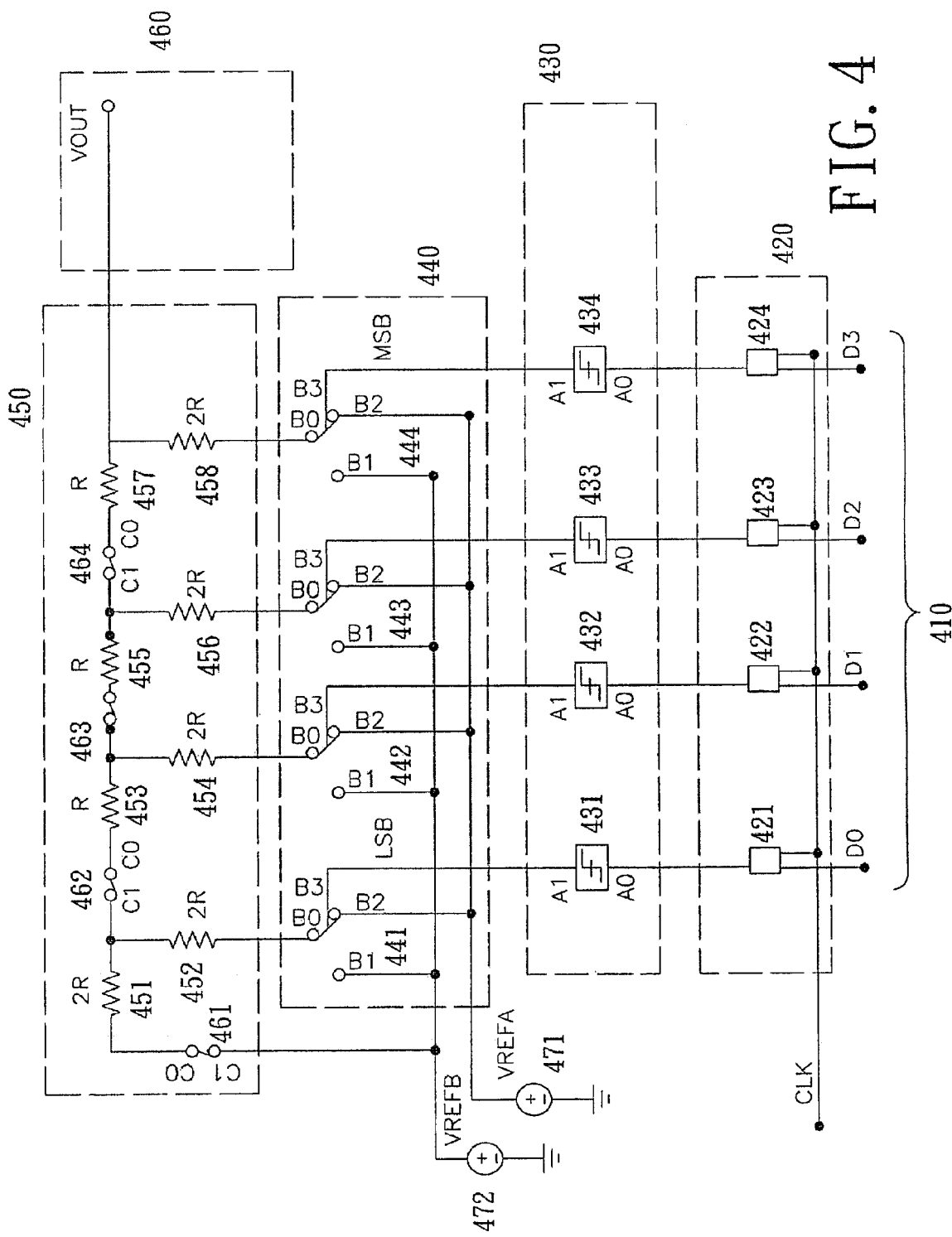
FIG. 4 is a circuit diagram of a digital to analog converter according to a first preferred embodiment of the present invention.

Referring to FIG. 4 of the drawings, a digital to analog converter according to a preferred embodiment of the present invention is illustrated, in which the digital to analog converter for an analog Liquid Crystal Display (LCD) comprises a digital input 410, a latching circuitry 420, a voltage level shifter circuitry 430, a switching circuitry 440, a resistance network with a resistance compensatory circuitry 450, and a LCD analog output 460. The digital input 410 contains a four digital input terminals D0, D1, D2, D3, appeared in the FIG. 4 as a 4 bit resistance network with a resistance compensatory circuitry to provide an analog output signal but may be easily expanded to n-bit with the addition of other series resistors, shunt resistors and additional switch control lines. The digital input 410 has a plurality of digital input terminals D0, D1, D2, D3 for receiving digital signals represented by at least one bit in binary representation with logic $1=V_{DD}$ and logic $0=V_{SS}$. (wherein VDD=3.3V, VSS=GND=0V for example)

The latching circuitry 420 is electrically connected with the digital input 410, and adapted to store the digital signals in the binary information received at the digital input 410. The latching circuitry 420 comprises a plurality of edge-triggered flip-flops 421, 422, 423, 424. The basic function of a flip-flop is to store one bit of binary information at logic level 1 or 0 so that the latching circuitry 420 could store the digital signals in the binary information received at the digital input 410, wherein the "edge-triggered" means the digital information at the digital input 410 is stored during the rising (or falling) edge of the clock signal CLK.

Figure 5:
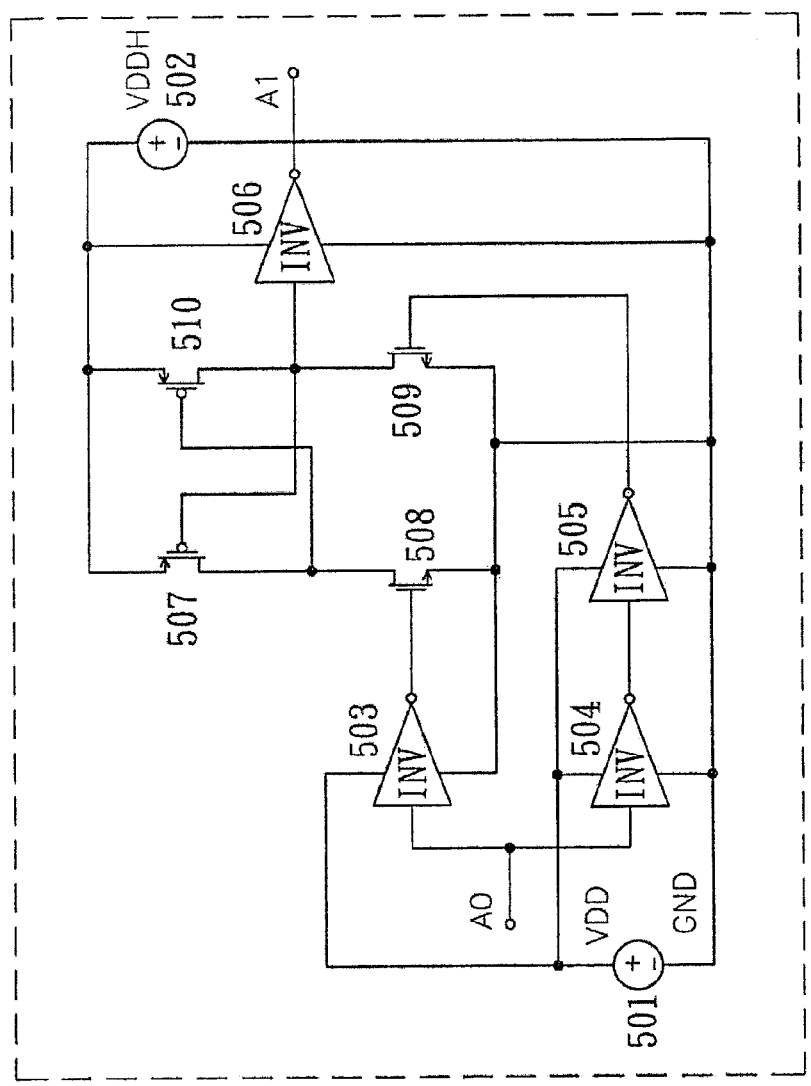
FIG. 5 is a circuit diagram of a voltage level shifter according to the above preferred embodiment of the present invention.

The voltage level shifter circuitry 430 is electrically connected with the latching circuitry 420 and adapted to shift low-voltage digital signals with logic $1=V_{DD}$ and logic $0=V_{SS}$ (where $V_{SS}$=GND=0V in this example) to higher voltage output signals voltage level with logic $1=V_{DDH}$ and logic $0=V_{SS}$, wherein $V_{DDH}$ is higher than $V_{DD}$. The voltage level shifter circuitry 430 comprises a plurality of voltage level shifters 431, 432, 433, 434. Each of the voltage level shifters 431, 432, 433, 434 is electrically connected with each of the edge-triggered logic flip-flops 421, 422, 423, 424 respectively for shifting a low-voltage digital signals with logic $1=V_{DD}$ and logic $0=V_{SS}$ to higher voltage output signals voltage level with logic $1=V_{DDH}$ and logic $0=V_{SS}$. Referring to FIG. 5 of the drawings, a circuit diagram for one of the voltage level shifters 431, 432, 433, 434 is illustrated, in which one of the voltage level shifters 431, 432, 433, 434 comprises a low-voltage DC power source 501 for providing a DC voltage $V_{DD}$ to a plurality of inverters 503, 504, 505 and a high-voltage DC power source 502 for providing a DC voltage $V_{DDH}$ to an inverters 506, a plurality of PMOS transistors 507, 510, and a plurality of NMOS transistors 508, 509. The inverters 506, the plurality of PMOS transistors 507, 510, and the plurality of NMOS transistors 508, 509 are connected between a high voltage terminal of the high-voltage DC power source 502 and the ground terminal GND. Also, the plurality of inverters 503, 504, 505 are connected between a high voltage terminal of the low-voltage DC power source 501 and the ground terminal GND. The connection of the inverters 506, the plurality of PMOS transistors 507, 510, the plurality of NMOS transistors 508, 509, and the plurality of inverters 503, 504, 505 is in a predetermined manner as shown. The label A0 denotes an input terminal of each of the voltage level shifters 431, 432, 433, 434 and the label A1 denotes an output terminal of each of the voltage level shifters 431, 432, 433, 434.

The switching circuitry 440 comprises a plurality of switches 441, 442, 443, 444. Each of switches 441, 442, 443, 444 comprises a first input terminal B1 connected to a second reference voltage source 472, a second input terminal B2 connected to a first reference voltage source 471, a control terminal B3 connected to each of the voltage level shifters 431, 432, 433, 434 respectively, and an output terminal B0. The first reference voltage source 471 provides a first reference DC voltage $V_{REFA}$ and the second reference voltage source 472 provides a second reference DC voltage $V_{REFB}$. The first reference DC voltage $V_{REFA}$ and the second reference DC voltage $V_{REFB}$ are adapted to adjust the output range of the digital to analog converter in order to conform the needed specification of the input voltage range of the red video terminal, the green video terminal, and the blue video terminal for use by the analog LCD, wherein the first reference DC voltage $V_{REFA}$ is higher than the second reference DC voltage $V_{REFB}$. Each of the switches 441, 442, 443, 444 is connected to the first reference voltage source 471 when the control terminal B3 receives binary 0 and the second reference voltage source 472 when the control terminal B3 receives binary 1. Thus, the output terminal B0 outputs the first reference DC voltage $V_{REFA}$ or the second reference DC voltage $V_{REFB}$.

The resistance network with a resistance compensatory circuitry 450 is electrically connected with the switching circuitry 440 and adapted to regulate a pattern of the analog output signal so as to optimize the analog output signal.

The LCD analog output 460 is electrically connected to the resistance network with a resistance compensatory circuitry 450 for outputting the optimized analog signal to the analog LCD.

Referring to FIG. 4 of the drawings, if the 4 bit resistance network with a resistance compensatory circuitry digital to analog converter expands to a n-bit resistance network with a resistance compensatory circuitry digital to analog converter, the digital input terminals of the digital input 410 are conventionally denoted as D0, D1, D2 . . . D(N−2), and D(N−1), where N is a natural number predetermined by the designers or manufacturers of the present invention.

The latching circuitry 420 comprises a plurality of logic edge-triggered flip-flops 421, 422, 423, 424 electrically connected to the four digital input terminals D0, D1, D2, D3 of the digital input 410 respectively, wherein the logic flip-flops 421, 422, 423, 424 are adapted to store the digital signal at the corresponding digital input terminals D0, D1, D2, D3. Thus, each of the logic flip-flops 421, 422, 423, 424 are triggered to operate by a binary signal which is received from the respective digital input terminals D0, D1, D2, D3.

Figure 6:
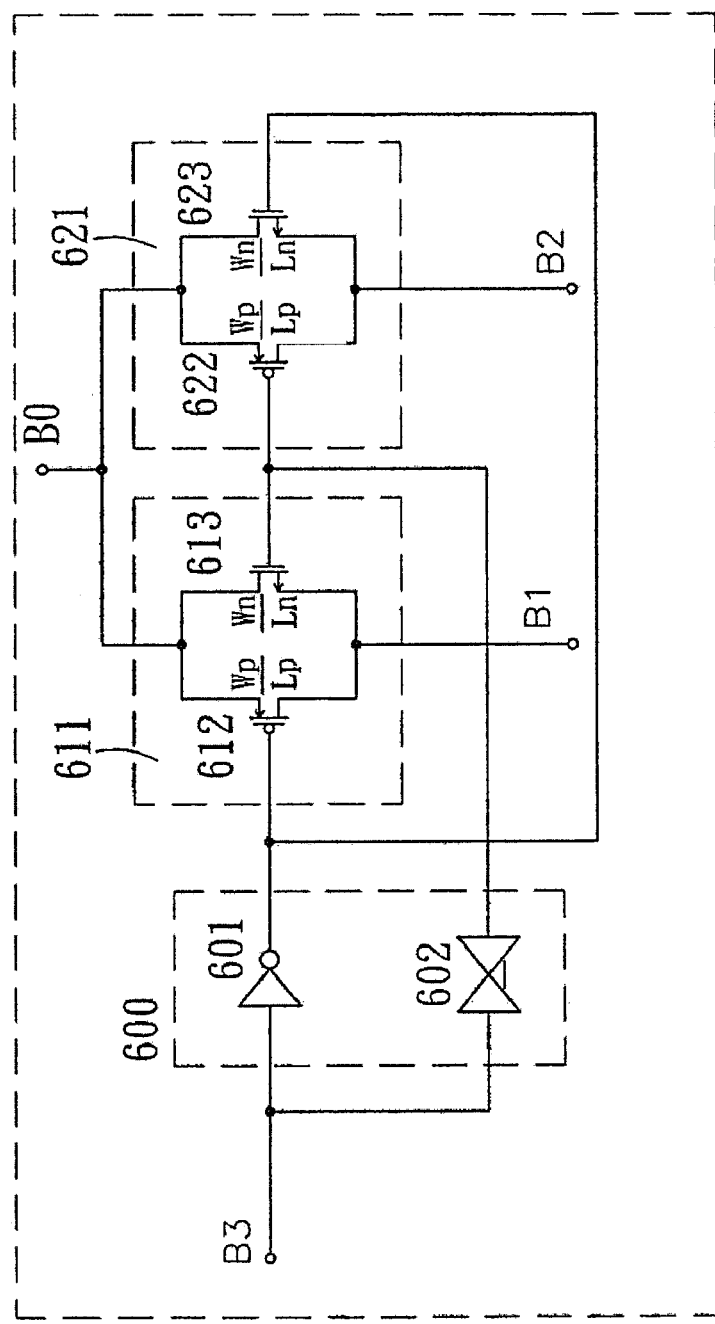
FIG. 6 is a circuit diagram of a switch according to the above preferred embodiment of the present invention.

Referring to FIG. 4 and FIG. 6 of the drawings, the switching circuitry 440 comprises a plurality of switches 441, 442, 443, 444 electrically connected with the voltage level shifters 431, 432, 433, 434 of the voltage level shifter circuitry 430 respectively such that the digital signals as shifted by the voltage level shifter circuitry 430 is fed into the resistance network with a resistance compensatory circuitry 450 in a periodic manner for achieving an optimal analog signal output. As mentioned before, thus the first reference DC voltage $V_{REFA}$ or the second reference DC voltage $V_{REFB}$ is fed to the resistance network with a resistance compensatory circuitry 450.

Referring to FIG. 6 of the drawings, each of switches 441, 442, 443, 444 comprises a driver controller 600 and two CMOS transistors 611, 621, wherein driver controller 600 output two different logic levels to control CMOS transistors 611, 621 turn on or turn off. A driver controller 600 can be constructed with an inverter 601 and transmission gate 602. Each of two CMOS transistors 611, 612 comprises a PMOS transistor 612 having a predetermined channel length Lp and a channel width Wp, and a NMOS transistor 613 having a predetermined channel length Ln and a channel width Wn. Since the impendence of a typical PMOS transistor or a NMOS transistor in a conduction state is determined by a ratio of the respective channel width and the respective channel length, as a result, by selecting an optimal PMOS transistor and NMOS transistor with suitable channel length and channel width, the impedance of the relevant CMOS transistors 611, 621 could be obtained.

Referring to FIG. 4 of the drawings, the resistance network with a resistance compensatory circuitry 450 comprises resistors 453, 455, 457, 451, 452, 454, 456, 458, a first CMOS compensatory circuitry 461, a second CMOS compensatory circuitry 462, a third CMOS compensatory circuitry 463, and a fourth CMOS compensatory circuitry 464. In this example, each of resistors 453, 455, 457 may have a predetermined resistance R, resistors 451, 452, 454, 456, 458 each may have a predetermined resistance 2R which is twice (×2) as the resistance R as the conventional R-2R network, or any other predetermined ratio of more than one. The first CMOS compensatory circuitry 461 is electrically connected with the second reference voltage source 472 and the resistor 451. The second CMOS compensatory circuitry 462 is electrically connected with the common node of the resistors 451, 452 and the resistor 453. The third CMOS compensatory circuitry 463 is electrically connected with the common node of the resistors 453, 454 and the resistor 455. The fourth CMOS compensatory circuitry 464 is electrically connected with the common node of the resistors 455, 456 and the resistor 457. Each of the resistors 452, 454, 456, 458 is connected with the output terminal B0 of each of the switches 441, 442, 443, 444 respectively. In a conduction state, the first CMOS compensatory circuitry 461, the second CMOS compensatory circuitry 462, the third CMOS compensatory circuitry 463, and the fourth CMOS compensatory circuitry 464 are adapted to regulate an impendence of the resistance network with a resistance compensatory circuitry 450 to optimally adjust the conversion from the digital signal to the analog signal used by the LCD. In other words, the first CMOS compensatory circuitry 461, the second CMOS compensatory circuitry 462, the third CMOS compensatory circuitry 463, and the fourth CMOS compensatory circuitry 464 are adapted to compensate the nonlinear phenomena caused by intrinsic resistances of the corresponding switches 441, 442, 443, 444.

It is important to point out that when the resistors of the resistance network 450 have doubled (×2) ratio resistors as the conventional R-2R network, and the ratio of the channel width to the channel length of each of the second CMOS compensatory circuitry 462, the third CMOS compensatory circuitry 463, and the fourth CMOS compensatory circuitry 464 is predetermined as twice as the ratio of the channel width to the channel length of the first CMOS compensatory circuitry 461 and CMOS transistors 611, 621 consisted in switches 441, 442, 443, 444 for achieving the optimal digital-analog conversion. The ratio may be any other larger than one value for any preferred digital to analog conversion characteristics.

Figure 7:
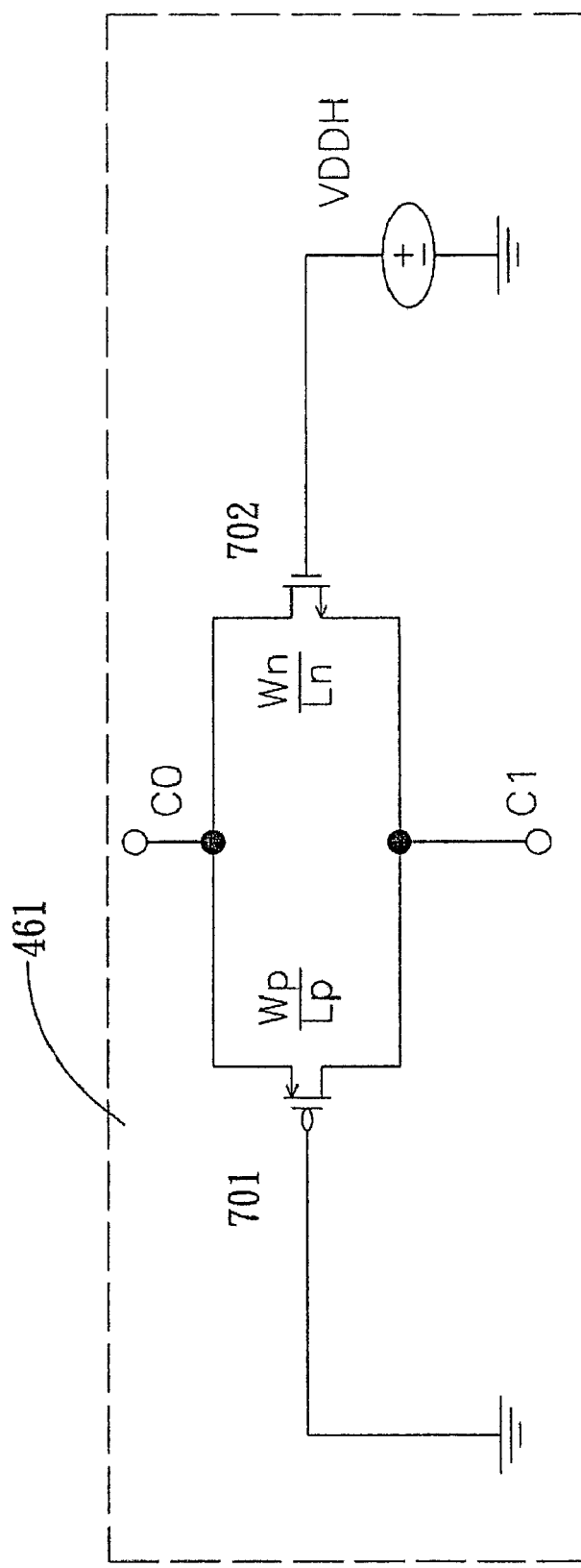
FIG. 7 is a circuit diagram of the first CMOS compensatory circuitry 461 in a conduction state according to the above preferred embodiment of the present invention.
Figure 8:
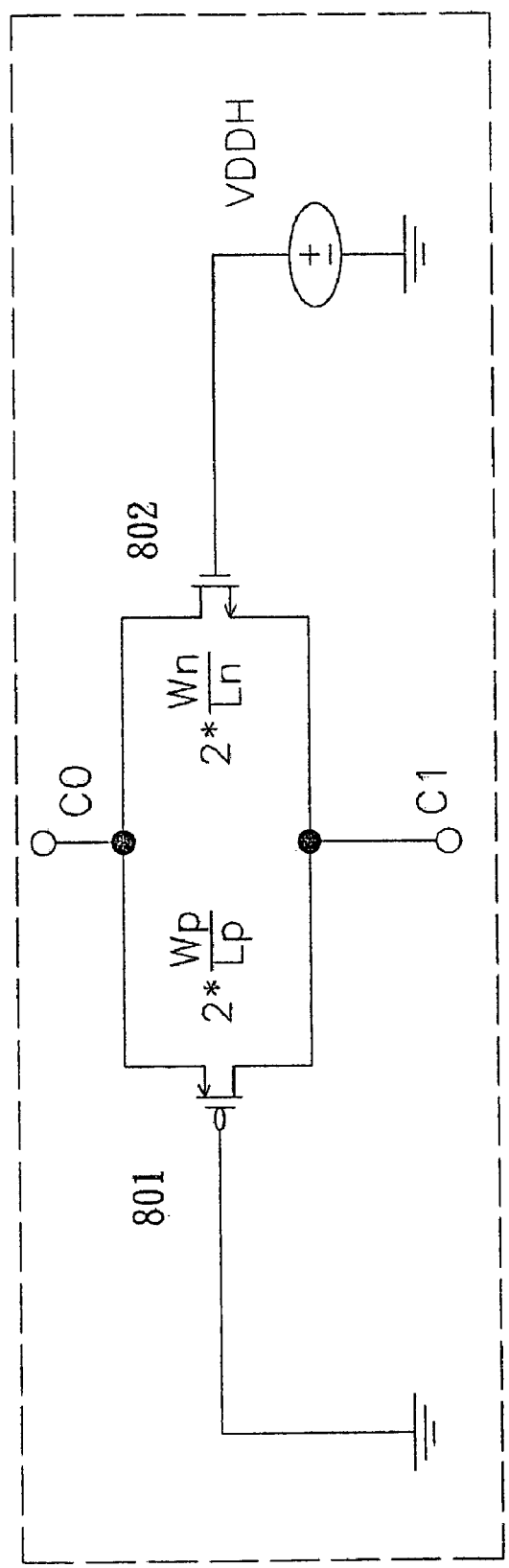
FIG. 8 is a circuit diagram of the second CMOS compensatory circuitry 462, the third CMOS compensatory circuitry 463, or the fourth CMOS compensatory circuitry 464 in a conduction state according to the above preferred embodiment of the present invention.

Referring to FIG. 7 to FIG. 8 of the drawings, circuit diagrams of the first CMOS compensatory circuitry 461, the second CMOS compensatory circuitry 462, the third CMOS compensatory circuitry 463, and the fourth CMOS compensatory circuitry 464 are illustrated. According to the preferred embodiment, the first CMOS compensatory circuitry 461 comprises a PMOS transistor 701 and a NMOS transistor 702. Each of the second CMOS compensatory circuitry 462, the third CMOS compensatory circuitry 463, and the fourth CMOS compensatory circuitry 464 comprises a PMOS transistor 801 and a NMOS transistor 802, wherein a ratio of the channel width to the channel length of the PMOS transistor 801 of the CMOS compensatory circuitry 462, 463, 464 is twice the ratio of the channel width to the channel length of the PMOS transistor 701 of the first CMOS compensatory circuitry 461 when the CMOS compensatory circuitry 462, 463, 464 and the first CMOS compensatory circuitry 461 are properly biased in a conduction state.

On the other hand, a ratio of the channel width to the channel length of the NMOS transistor 802 of the CMOS compensatory circuitry 462, 463, 464 is predetermined as twice the ratio of the channel width to the channel length of the NMOS transistor 702 of the first CMOS compensatory circuitry 461 when the CMOS compensatory circuitry 462, 463, 464 and the first CMOS compensatory circuitry 461 are properly biased in a conduction state, wherein the gate of the NMOS 802 is biased to VDDH and the gate of the PMOS is biased to GND. In some particular applications, the bias of the transistors 801 and 802 may be considered as the other voltages.

At this point, the LCD analog output 460 is electrically connected with the resistance network with resistance compensatory circuitry 450 and adapted to transmit the analog signal as converted from the digital signal to the analog LCD.

The operation of the digital to analog converter is described as follows with reference to FIG. 4 of the drawings:

First, the latching circuitry 420 is adapted to store and retain the digital signal from the digital input terminals of the digital input 410 and transmits the stored digital signal to the voltage level shifter circuitry 430 when the latching circuitry 420 is triggered by a subsequent digital signal.

Second, the digital signal stored by the latching circuitry 420 is shifted by the voltage level shifter circuitry 430 from lower amplitude to higher amplitude, wherein the amplified signal is fed to the switching circuitry 440.

Finally, the resistance network with a resistance compensatory circuitry 450 adjusts the impendence to compensate the nonlinear phenomena caused by intrinsic resistances of the corresponding switch of the switching circuitry 440. So, the resistance network with a resistance compensatory circuitry digital to analog converter outputs an optimal analog signal to the analog type LCD.

Figure 9:
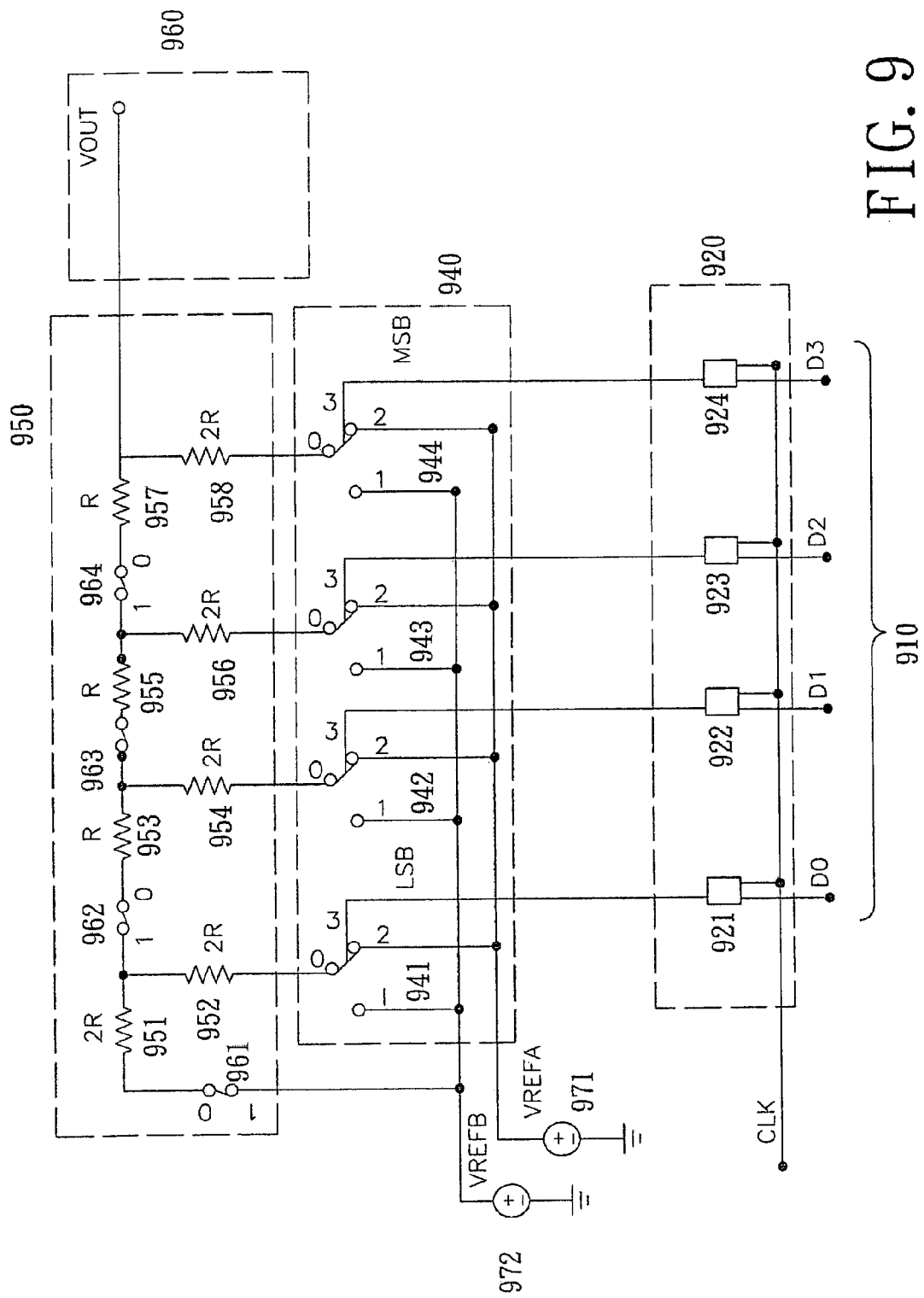
FIG. 9 is a circuit diagram of a digital to analog converter according to a second preferred embodiment of the present invention.

Please refer to FIG. 9 which is a circuit diagram of a digital to analog converter according to a second preferred embodiment of the present invention. In this embodiment, the digital to analog converter comprises a digital input 910, a latching circuitry 920, a switching circuitry 940, a resistance network with a resistance compensatory circuitry 950, and a LCD analog output 960.

Figure 10:
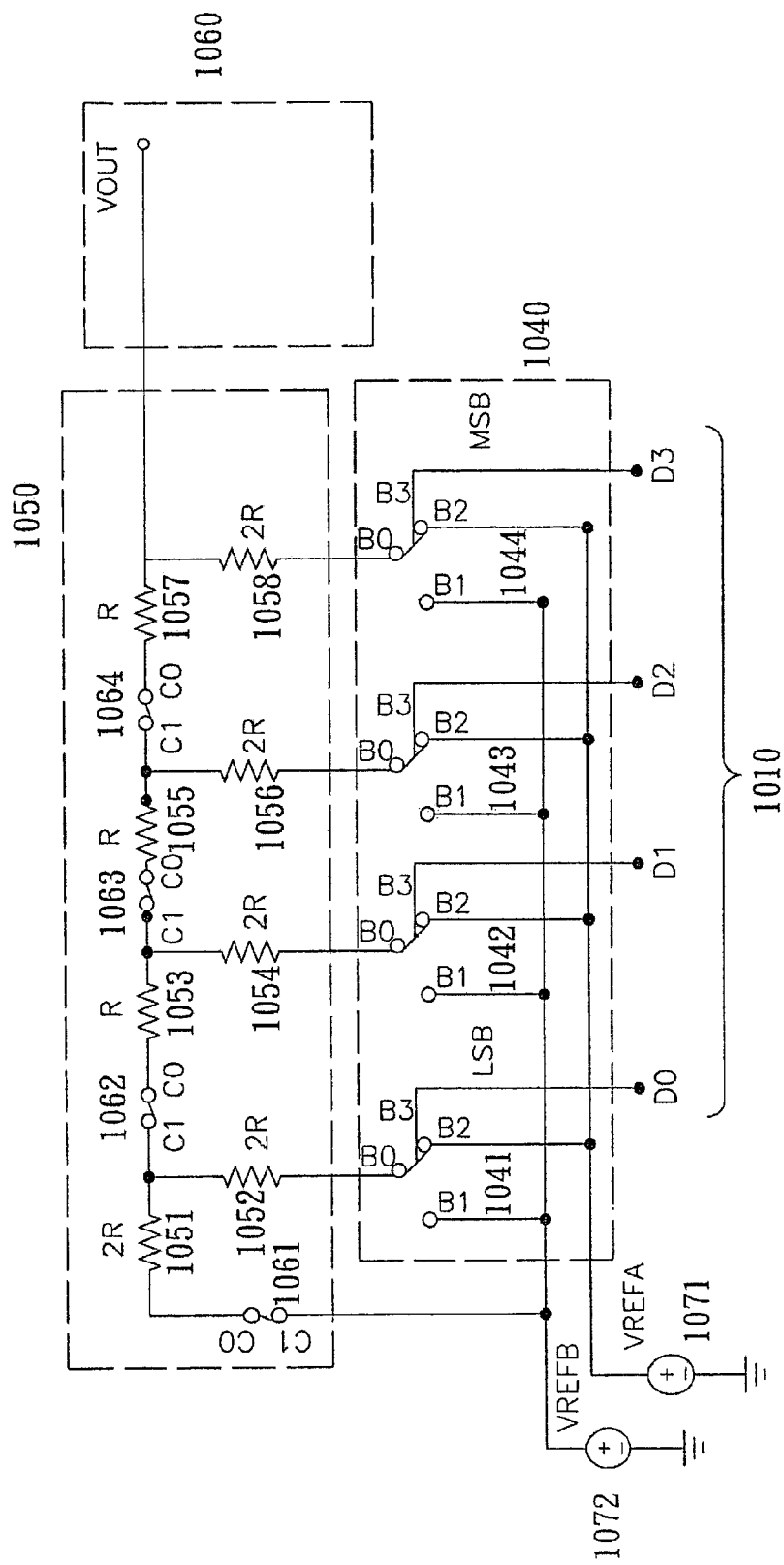
FIG. 10 is a circuit diagram of a digital to analog converter according to a third preferred embodiment of the present invention.

Please refer to FIG. 10 which is a circuit diagram of a digital to analog converter according to a third preferred embodiment of the present invention. In this embodiment, the digital to analog converter comprises a digital input 1010, a switching circuitry 1040, a resistance network with a resistance compensatory circuitry 1050, and a LCD analog output 1060.

From the forgoing descriptions, it can be shown that the above objects have been substantially achieved. The present invention effectively provides an effective and flexible means of converting a digital signal into an analog signal in a resources and cost-effective manner.

One skilled in the art will understand that the embodiment of the present invention as shown in the drawings and described above is exemplary only and not intended to be limiting.

It will thus be seen that the objects of the present invention have been fully and effectively accomplished. These embodiments have been shown and described for the purposes of illustrating the functional and structural principles of the present invention and are subject to change without departure from such principles. Therefore, this invention includes all modifications encompassed within the spirit and scope of the following claims.

What is claimed is:

1. A digital to analog converter to convert a digital input signal into an analog output signal, comprising:
   a digital input having a plurality of digital input terminals for receiving said digital input signal;
   a switching circuitry comprising a plurality of switches, each switch comprising:
      an output terminal;
      a first input terminal electrically connected with a second voltage source in which said second voltage source provides a second reference DC voltage;
      a second input terminal electrically connected with a first voltage source in which said first voltage source provides a first reference DC voltage; and
      a control terminal electrically connected with said corresponding digital input terminal for selectively coupling one of said first input terminal and said second input terminal to said output terminal such that one of said first reference DC voltage and said second reference DC voltage outputted to said output terminal is determined by said digital input signal; and
   a resistance network with a resistance compensatory circuitry comprising:
      a set of series resistors;
      a plurality of CMOS compensatory circuitries electrically connected between two of said series resistors; and
      a set of shunt resistors each electrically connected to a plurality of common nodes of said series resistors and said CMOS compensatory circuitries respectively, wherein said CMOS compensatory circuitries are adapted to adjust the conversion from said digital input signal into said analog output signal.

2. The digital to analog converter, as recited in claim 1, wherein said first reference DC voltage is higher than said second reference DC voltage.

3. The digital to analog converter, as recited in claim 1, wherein each of said switches comprises a driver controller and two CMOS transistors, wherein said driver controller outputs two different logic levels to control CMOS transistor turn on or off and each of two CMOS transistors comprises a PMOS transistor having a first channel length and a first channel width, and a NMOS transistor having a second channel length and a second channel width such that an impedance of said switch is determined by a ratio of said respective channel width and said respective channel length.

4. The digital to analog converter, as recited in claim 1, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

5. The digital to analog converter, as recited in claim 2, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

6. The digital to analog converter, as recited in claim 3, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

7. A digital to analog converter to convert a digital input signal into an analog output signal, comprising:
   a digital input having a plurality of digital input terminals for receiving said digital input signal;
   a latching circuitry electrically connected with said digital input and adapted to store said digital input signal in the binary information received at said digital input;
   a switching circuitry comprising a plurality of switches, each switch comprising:
      an output terminal;
      a first input terminal electrically connected with a second voltage source in which said second voltage source provides a second reference DC voltage;
      a second input terminal electrically connected with a first voltage source in which said first voltage source provides a first reference DC voltage; and
      a control terminal electrically connected with said latching circuitry for selectively coupling one of said first input terminal and said second input terminal to said output terminal such that one of said first reference DC voltage and said second reference DC voltage outputted to said output terminal is determined by said digital input signal; and
   a resistance network with a resistance compensatory circuitry comprising:
      a set of series resistors;
      a plurality of CMOS compensatory circuitries electrically connected between two of said series resistors; and
      a set of shunt resistors each electrically connected to a plurality of common nodes of said series resistors and said CMOS compensatory circuitries respectively, wherein said CMOS compensatory circuitries are adapted to adjust the conversion from said digital input signal into said analog output signal.

8. The digital to analog converter, as recited in claim 7, wherein said first reference DC voltage is higher than said second reference DC voltage.

9. The digital to analog converter, as recited in claim 7, wherein said latching circuitry comprises a plurality of edge-triggered flip-flops for storing said digital input signal from the binary information received at said digital input.

10. The digital to analog converter, as recited in claim 8, wherein said latching circuitry comprises a plurality of edge-triggered flip-flops for storing said digital input signal from the binary information received at said digital input.

11. The digital to analog converter, as recited in claim 7, wherein each of said switches comprises a driver controller and two CMOS transistors, wherein said driver controller outputs two different logic levels to control CMOS transistor turn on or off and each of two CMOS transistors comprises a PMOS transistor having a first channel length and a first channel width, and a NMOS transistor having a second channel length and a second channel width such that an impedance of said switch is determined by a ratio of said respective channel width and said respective channel length.

12. The digital to analog converter, as recited in claim 9, wherein each of said switches comprises a driver controller and two CMOS transistors, wherein said driver controller outputs two different logic levels to control CMOS transistor turn on or off and each of two CMOS transistors comprises a PMOS transistor having a first channel length and a first channel width, and a NMOS transistor having a second channel length and a second channel width such that an impedance of said switch is determined by a ratio of said respective channel width and said respective channel length.

13. The digital to analog converter, as recited in claim 7, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

14. The digital to analog converter, as recited in claim 10, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

15. The digital to analog converter, as recited in claim 11, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor in consisting said switch.

16. The digital to analog converter, as recited in claim 12, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

17. A digital to analog converter to convert a digital input signal into an analog output signal, comprising:
- a digital input having a plurality of digital input terminals for receiving said digital input signal;
- a latching circuitry electrically connected with said digital input and adapted to store said digital input signal in the binary information received at said digital input;
- a voltage level shifter circuitry electrically connected with said latching circuitry and adapted to shift said digital input signal to a digital output signal, wherein a voltage level of said digital output signal is higher than that of said digital input signal;
- a switching circuitry comprising a plurality of switches, each switch comprising:
  - an output terminal;
  - a first input terminal electrically connected with a second voltage source in which said second voltage source provides a second reference DC voltage;
  - a second input terminal electrically connected with a first voltage source in which said first voltage source provides a first reference DC voltage; and
  - a control terminal electrically connected with said voltage level shifter circuitry for selectively coupling one of said first input terminal and said second input terminal to said output terminal such that one of said first reference DC voltage and said second reference DC voltage outputted to said output terminal is determined by said digital input signal; and
- a resistance network with a resistance compensatory circuitry comprising:
  - a set of series resistors;
  - a plurality of CMOS compensatory circuitries electrically connected between two of said series resistors; and
  - a set of shunt resistors each electrically connected to a plurality of common nodes of said series resistors and said CMOS compensatory circuitries respectively, wherein said CMOS compensatory circuitries are adapted to adjust the conversion from said digital input signal into said analog voltage output signal.

18. The digital to analog converter, as recited in claim 17, wherein said first reference DC voltage is higher than said second reference DC voltage.

19. The digital to analog converter, as recited in claim 17, wherein said latching circuitry comprises a plurality of edge-triggered flip-flops for storing said digital input signal from the binary information received at said digital input.

20. The digital to analog converter, as recited in claim 18, wherein said latching circuitry comprises a plurality of edge-triggered flip-flops for storing said digital input signal from the binary information received at said digital input.

21. The digital to analog converter, as recited in claim 19, wherein said voltage level shifter circuitry comprises a plurality of voltage level shifters, each of said voltage level shifters is electrically connected with each of the edge-triggered logic flip-flops respectively for shifting said digital input signal to said digital output signal.

22. The digital to analog converter, as recited in claim 17, wherein each of said switches comprises a driver controller and two CMOS transistors, wherein said driver controller outputs two different logic levels to control CMOS transistor turn on or off and each of two CMOS transistors comprises a PMOS transistor having a first channel length and a first channel width, and a NMOS transistor having a second channel length and a second channel width such that an impedance of said switch is determined by a ratio of said respective channel width and said respective channel length.

23. The digital to analog converter, as recited in claim 21, wherein each of said switches comprises a driver controller and two CMOS transistors, wherein said driver controller outputs two different logic levels to control CMOS transistor turn on or off and each of two CMOS transistors comprises a PMOS transistor having a first channel length and a first channel width, and a NMOS transistor having a second channel length and a second channel width such that an impedance of said switch is determined by a ratio of said respective channel width and said respective channel length.

24. The digital to analog converter, as recited in claim 17, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

25. The digital to analog converter, as recited in claim 22, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

26. The digital to analog converter, as recited in claim 23, wherein said resistance compensatory circuitry comprises a plurality of CMOS compensatory circuitries, in which each CMOS compensatory circuitry comprises a PMOS transistor and a NMOS transistor, wherein a ratio of a channel width to a channel length of said PMOS transistor or NMOS transistor is twice a ratio of a channel width to a channel length of said PMOS transistor or NMOS transistor in CMOS transistor consisting said switch.

* * * * *